US011195679B2

(12) United States Patent
Hofsaess (10) Patent No.: US 11,195,679 B2
(45) Date of Patent: Dec. 7, 2021

(54) TEMPERATURE-DEPENDENT SWITCH

(71) Applicant: Marcel P. Hofsaess, Kyffhaeuserland Ortsteil Steintahleben (DE)

(72) Inventor: Marcel P. Hofsaess, Kyffhaeuserland Ortsteil Steintahleben (DE)

( * ) Notice: Subject to any disclaimer, the term of this patent is extended or adjusted under 35 U.S.C. 154(b) by 0 days.

(21) Appl. No.: 16/692,458

(22) Filed: Nov. 22, 2019

(65) Prior Publication Data

US 2020/0168417 A1    May 28, 2020

(30) Foreign Application Priority Data

Nov. 28, 2018 (DE) .................. 10 2018 130 078.6
Jun. 7, 2019 (WO) ............. PCT/EP2019/064926
Oct. 25, 2019 (EP) ...................... 19205405

(51) Int. Cl.
*H01H 37/54* (2006.01)
*H05K 3/30* (2006.01)
*H01H 1/58* (2006.01)
*H01H 37/72* (2006.01)
*H05K 1/18* (2006.01)
*H01H 37/04* (2006.01)
*H05K 3/34* (2006.01)

(52) U.S. Cl.
CPC .... *H01H 37/5427* (2013.01); *H01H 37/5436* (2013.01); *H05K 3/303* (2013.01); *H01H 37/72* (2013.01); *H01H 2001/5888* (2013.01); *H01H 2037/046* (2013.01); *H05K 1/181* (2013.01); *H05K 3/341* (2013.01); *H05K 2201/10053* (2013.01)

(58) Field of Classification Search
CPC ....... H01H 37/5427; H01H 2001/5888; H01H 37/72; H01H 2037/046; H01H 37/5436; Y02P 70/50; H05K 2201/10053; H05K 1/181; H05K 3/341; H05K 3/301; H05K 3/303
USPC .................................. 337/380, 381
See application file for complete search history.

(56) References Cited

U.S. PATENT DOCUMENTS 3,414,225 A    12/1968  Lester
4,216,350 A *  8/1980  Reid .................. B23K 35/0222
                                                174/261

(Continued)

FOREIGN PATENT DOCUMENTS

DE        19517310 A1    11/1996
DE        19623570 A1     1/1998
(Continued)

*Primary Examiner* — Stephen S Sul
(74) *Attorney, Agent, or Firm* — Harness, Dickey & Pierce, P.L.C.

(57) ABSTRACT

A temperature-dependent switch includes a housing with a top face and an outer face that runs transversely to the top face. The switch includes a first outer contact area that is arranged on the top face. The switch includes a second outer contact area that is arranged at the housing. The switch includes a temperature-dependent switching mechanism that is arranged in the housing and configured to establish or open an electrically conductive connection between the first and the second outer contact area depending on a temperature of the switching mechanism. The housing is disposed in a metal mounting cap that includes a wall. An upper rim of the wall protrudes beyond the top face of the housing. An inner side of the wall bears at least partially against the outer face of the housing.

18 Claims, 8 Drawing Sheets

(56) References Cited

U.S. PATENT DOCUMENTS

| | | | | |
|---|---|---|---|---|
| 4,297,668 A | * | 10/1981 | Place | H01H 37/5436 248/229.26 |
| 5,877,671 A | | 3/1999 | Hofsass | |
| 6,249,211 B1 | * | 6/2001 | Hofsaess | H01H 1/504 337/333 |
| 6,302,361 B1 | * | 10/2001 | Schaefer | H05K 5/0017 200/296 |
| 6,417,758 B1 | * | 7/2002 | Russell | H01H 37/043 165/80.1 |
| 8,284,011 B2 | * | 10/2012 | Hofsaess | H01H 37/04 337/381 |
| 10,541,096 B2 | | 1/2020 | Hofsaess | |
| 2003/0034872 A1 | | 2/2003 | Scott et al. | |
| 2008/0066477 A1 | * | 3/2008 | Aoki | B60H 1/00785 62/150 |
| 2010/0090793 A1 | * | 4/2010 | Takeda | H01H 37/5436 337/298 |
| 2011/0050385 A1 | * | 3/2011 | Hofsaess | H01H 37/5427 337/380 |
| 2014/0167907 A1 | | 6/2014 | Hofsaess | |
| 2016/0141128 A1 | * | 5/2016 | Kirch | H01H 37/04 337/365 |
| 2017/0062160 A1 | | 3/2017 | Hofsaess | |
| 2019/0051477 A1 | | 2/2019 | Hofsaess | |

FOREIGN PATENT DOCUMENTS

| | | |
|---|---|---|
| DE | 19827113 C2 | 11/2001 |
| DE | 102012112207 B3 | 2/2014 |
| DE | 10 2014 116 888 A1 | 6/2016 |
| DE | 10 2015 110 509 A1 | 1/2017 |
| EP | 3 136 416 A1 | 3/2017 |
| EP | 3 270 401 A1 | 1/2018 |
| JP | S52103684 A | 8/1977 |

\* cited by examiner

TEMPERATURE-DEPENDENT SWITCH

CROSS-REFERENCE TO RELATED APPLICATIONS

This application claims priority under 35 U.S.C. § 365(a) to International patent application PCT/EP2019/064926, filed Jun. 7, 2019 and claims priority under 35 U.S.C. § 119 to German patent application DE 10 2018 130 078.6, filed on Nov. 28, 2018 and European patent application EP 19 205 405.4, filed on Oct. 25, 2019. The entire contents of these priority applications are incorporated herein by reference.

BACKGROUND OF THE INVENTION

This disclosure relates to a temperature-dependent switch having a housing which comprises a top face and an outer face which runs transversely to said top face, having at least one first outer contact area which is arranged on the top face, at least one second outer contact area which is arranged on the outside of the housing, and having a temperature-dependent switching mechanism which is arranged in the housing and, depending on its temperature, establishes or opens an electrically conductive connection between the first and the second outer contact area.

An exemplary temperature-dependent switch is known from DE 196 23 570 A1. Said switch serves to monitor the temperature of a device. To this end, it is brought into thermal contact, for example by means of one of its outer faces, with the device to be protected, so that the temperature of the device to be protected influences the temperature of the switching mechanism.

The switch is connected electrically in series into the electrical supply circuit of the device to be protected via connection lines which are soldered to its two outer contact areas, so that the supply current of the device to be protected flows through the switch below the response temperature of the switch.

The switch has a deep-drawn bottom part in which an internally encircling shoulder on which a cover part rests is provided. The cover part is held fixedly on said shoulder by a raised encircling wall of the bottom part, which encircling wall is bent inward through approximately 60° in its upper section.

Since the cover part and the bottom part are manufactured from electrically conductive material, an insulating film is also provided between said cover part and said bottom part, which insulating film runs around the cover part, extends parallel to the cover part inside the switch and is raised laterally upward, so that its edge region extends as far as the top face of the cover part. In the process, the bent upper section of the encircling wall of the bottom part rests on the edge region of the insulating film, wherein the wall and the edge region of the insulating film run away at an angle of approximately 30° in relation to the top face of the cover part from said top face. The end side of the upper section of the encircling wall is therefore at an angle of 90° in relation to the insulating film.

The temperature-dependent switching mechanism comprises a spring-mounted snap-action disk, which supports the moving contact part, and a bimetallic disk which is turned over the moving contact part. The spring-mounted snap-action disk pushes the moving contact part against a stationary mating contact on the inside of the cover part.

The spring-mounted snap-action disk, by way of its rim, is supported in the bottom part of the housing, so that the electric current flows from the bottom part through the spring-mounted snap-action disk and the moving contact part into the stationary mating contact and from there into the cover part.

A first outer contact area, which is arranged centrally on the cover part, serves as a first outer connection. A second outer contact area which is provided on the flanged rim of the bottom part serves as a second outer connection. However, it is also possible to not arrange the second outer connection on the rim but to arrange said second outer connection laterally on the current-conducting housing or on the bottom side of the bottom part.

It is known from DE 198 27 113 C2 to fit a so-called contact link to the spring-mounted snap-action disk, said contact link being pushed by the spring-mounted snap-action disk against two stationary mating contacts which are provided on the cover part. In this case, the second outer contact area is also arranged on the top face of the cover part. The two mating contacts are connected to the two outer contact areas through the cover part. The current then flows from an outer contact area via the associated mating contact through the contact link into the other stationary mating contact and from there to the other outer contact area, so that the operating current does not flow through the spring-mounted snap-action disk itself.

This design is selected in particular when very high currents need to be switched which can no longer be conducted via the spring-mounted disk itself without any problems.

In both design variants, a bimetallic disk is provided for the temperature-dependent switching function, said bimetallic disk lying in the switching mechanism free of forces below its critical temperature, wherein it is arranged geometrically between the contact part or the contact link and the spring-mounted snap-action disk.

Herein, a bimetallic part is understood to mean a multi-layered, active, sheet-like component part comprising two, three or four components which are connected to one another in an inseparable manner and have different coefficients of expansion. The connection of the individual layers of metals or metal alloys is cohesive or interlocking and is achieved by rolling, for example.

Bimetallic parts of this kind have a first stable geometric conformation in their low temperature setting and a second stable geometric conformation in their high temperature setting, between which settings they jump in a temperature-dependent fashion in the manner of a hysteresis. In the event of changes in temperature beyond their response temperature or below their return temperature, the bimetallic parts snap over into the respective other conformation. The bimetallic parts are therefore often referred to as snap-action disks, where they can have an elongate, oval or circular form in plan view.

If the temperature of the bimetallic disk now increases as a result of an increase in temperature in the device to be protected beyond the critical temperature, the bimetallic disk changes its configuration and operates counter to the spring-mounted snap-action disk so that it lifts off the moving contact part from the stationary mating contact or the current transfer element from the two stationary mating contacts, with the result that the switch opens and the device to be protected is disconnected and cannot heat up any further.

With these designs, the bimetallic disk is mounted free of mechanical forces below its critical temperature, wherein the bimetallic disk is not used for carrying the current either.

In this case, it is advantageous for the bimetallic disks to have a long mechanical service life and for the switching point, that is to say the critical temperature of the bimetallic disk, to not change even after many switching cycles.

If less stringent requirements are placed on the mechanical reliability or the stability of the critical temperature, the bimetallic snap-action disk can also take on the function of the spring-mounted snap-action disk and possibly even the current transfer element, so that the switching mechanism only comprises a bimetallic disk, which then supports the moving contact part or has two contact areas instead of the current transfer element, so that the bimetallic disk not only ensures the closing pressure of the switch, but also carries the current in the closed state of the switch.

Furthermore, it is known to provide temperature-dependent switches with a shunt which is connected in parallel with the outer connections. This shunt takes over a portion of the operating current when the switch is open and keeps the switch at a temperature above the critical temperature, so that the switch does not automatically close again after cooling. Switches of this kind are sometimes referred to as latching switches.

It is furthermore known to provide temperature-dependent switches with a series resistor, through which the operating current flowing through the switch flows. In this way, ohmic heat is generated in the series resistor, which ohmic heat is proportional to the square of the current flowing. If the current intensity exceeds a permissible degree, the heat of the series resistor results in the switching mechanism being opened.

In this way, a device to be protected is already disconnected from its electrical supply circuit when an excessively high current flow can be registered which has not yet resulted in excessive heating of the device.

Instead of a generally round bimetallic disk, a bimetallic spring which is clamped on one side and supports a moving contact part or a contact link can also be used.

However, it is also possible to use temperature-dependent switches which do not have a contact plate but rather a spring part as the current transfer element, said spring part supporting the two mating contacts or the two mating contacts being formed on said spring part. The spring part can be a bimetallic part, in particular a bimetallic snap-action disk, which not only ensures the temperature-dependent switching function, but at the same time also ensures the contact pressure and conducts the current when the switch is closed.

All of these different design variants can also be realized with the herein presented switch; in particular, the bimetallic disk can also take on the function of the spring-mounted snap-action disk.

DE 195 17 310 A1 discloses a temperature-dependent switch which has a comparable construction to that from DE 196 23 570 A1 mentioned at the outset, in which the cover part is manufactured from a PTC thermistor material, however, and can rest on an internally encircling shoulder of the bottom part without the interposition of an insulating film, said cover part being pushed onto said shoulder by the upper section of the encircling wall of the bottom part which is bent radially inward through approximately 90°.

In this way, the PTC thermistor cover is connected electrically in parallel with the two outer connections, so that it imparts a latching function to the switch.

PTC thermistors of this kind are manufactured, for example, from semi-conductive, polycrystalline ceramics such as BaTiO3.

In the case of the temperature-dependent switch having a contact link known from the abovementioned document DE 198 27 113 C2 as well, the cover part is manufactured from a PTC thermistor material, so that it likewise has a latching function. In this case, two rivets are arranged on the cover part, the external heads of said rivets forming the two outer connections, and the internal heads of said rivets, as stationary mating contacts, interacting with the contact link.

DE 10 2015 110 509 A1 describes developments of the switches known from DE 196 23 570 A1 and DE 198 27 113 C2, in which the upper section of the encircling wall of the bottom part, which upper section engages over the cover part, is in the form of a continuously curved rim which, by way of its end side, pushes onto the protective film. In this case, the upper section of the encircling wall is not bent radially inward, but rather bent over into itself, so that it forms a continuously curved rim in the manner of a bead, wherein it comes into contact with the protective foil by way of its end side.

A further insulating film which extends as far as below the first insulating film additionally rests on the top face, so that a double seal is produced by the two insulating films as it were.

DE 10 2015 110 509 A1 further proposes manufacturing the known switch as a surface mounted device (SMD) using the reel technique (belt and coil) and placing said switch on a printed circuit board using pick and place SMD automatic placement machines and mounting it there and making contact with said switch using a reflow process for example. Both the curved rim and also the one or the two contact areas on the top face of the cover part are intended to be used as a contact area for the surface mounted technology (SMT) connection in this case.

To this end, the switch is placed on the printed circuit board by way of the cover part, so that the contact area or the contact areas on the top face of the cover part and the curved rim are available for making contact using SMT. In this case, the rim serves to mechanically secure and thermally connect the switch to the printed circuit board and also to make electrical contact if there is only one contact area on the top face of the cover part.

However, SMD mounting with the structure proposed in DE 10 2015 110 509 A1 is associated with considerable problems in respect of mass production. In the case of many of the switches manufactured in accordance with DE 10 2015 110 509 A1, the curved rim projects noticeably beyond the contact area on the top face, and therefore a secure contact-connection at the contact area is not ensured. DE 10 2015 110 509 A1 proposes equalizing the difference in height using the solder in the reflow process, but this has not proven expedient in practice.

In addition, the insulating film on the cover is relatively thick and therefore impedes, sometimes even prevents, the process of making contact with the connection areas. In addition, the insulating film which extends around the cover is so stiff that it projects upward in spite of the bent-over rim and impedes, sometimes even prevents, the process of making contact with the rim.

SUMMARY OF THE INVENTION

It is an object to reduce the abovementioned problems in respect of SMD mounting in a structurally simple and economical manner.

According to a first aspect, a temperature-dependent switch is presented, which comprises a housing with a top face and an outer face which runs transversely to said top face. The switch further comprises a first outer contact area which is arranged on the top face, a second outer contact area which is arranged at the housing, and a temperature-dependent switching mechanism which is arranged in the housing and configured to establish or open an electrically conductive connection between the first and the second outer contact area depending on a temperature of said switching mechanism. The housing is disposed in a metal mounting cap which comprises a wall, wherein an upper rim of said wall protrudes beyond the top face of the housing, and wherein an inner side of said wall bears at least partially against the outer face of the housing.

Hence, the switch itself does not necessarily have to be changed, but rather a mounting cap is provided, which mounting cap can be designed for any type of temperature-dependent switch and can serve both for electrical connection and also for mechanical fixing.

Therefore, any desired switch designs can be used for SMD mounting because the rim of the mounting cap can be used as a connection and/or for holding and sealing purposes. In this case, the rim surrounds the switch such that it can also be hermetically sealed off by filling, this rendering switches received in this way usable for particular classes of protection.

In this case, the projection of the rim can be very easily matched to the height of the connection areas when, for example, rivets pass through the cover, the outer heads of which rivets form the contact areas. Fully automatic soldering is also possible without problems.

Preferably, the mounting cap is manufactured as a separate part which serves only to position the switch, so that the dimensions of the rim can be paramount here, whereas the switching reliability, which is affected by the arrangement, orientation and functioning of the switching mechanism, is always paramount in the case of a switch.

Dividing the requirements of "switching reliability" and "mounting reliability" between firstly the temperature-dependent switch and secondly the mounting cap eliminates the above-mentioned problems of prior art switches.

Although an additional component is generally rather disadvantageous in respect of cost and assembly, these disadvantages are, however, expected to be more than compensated for on account of it being possible to use different, existing switch designs in a reliable manner for SMD mounting with the new mounting cap.

Therefore, it is not necessary to design new switches, but rather all the switches of which the design and functioning have proven expedient can now be used for SMD mounting.

According to a second aspect, an electronic circuit is presented which comprises a temperature-dependent switch which is mounted on a printed circuit board, said switch having a housing with a top face and an outer face which runs transversely to said top face, said switch further having a first outer contact area which is arranged on the top face, a second outer contact area which is arranged at the housing, and a temperature-dependent switching mechanism which is arranged in the housing and configured to establish or open an electrically conductive connection between the first and the second outer contact area depending on a temperature of said switching mechanism, wherein the housing is disposed in a metal mounting cap which comprises a wall, wherein an upper rim of said wall protrudes beyond the top face of the housing, wherein an inner side of said wall bears at least partially against the outer face of the housing, and wherein said upper rim rests on the printed circuit board According to a refinement, provision is made for the upper rim of the wall of the mounting cap to lie in a common plane with the first outer contact area.

This has the advantage that the mounting cap directly ensures the orientation of the rim and of the first outer contact area in relation to one another, which orientation is necessary for SMD mounting. Since the upper rim of the mounting cap lies in a plane with the first outer contact area, the switch, together with the mounting cap upside-down, can be arranged on a printed circuit board and the rim and also the first outer contact area can be connected (e.g. soldered) to corresponding conductor tracks, without height equalization between the rim of the mounting cap and the first outer contact area being absolutely necessary for this purpose.

In a further refinement, the housing comprises a cover part, on which the top face is formed, and a bottom part, on which the outer face of the housing is formed, wherein the cover part is held on the bottom part, and wherein the inner side of the wall of the mounting cap preferably bears against the outer face of the bottom part over its entire surface area.

It is advantageous here to use standard switches which are usually round or circular, which can be readily and easily inserted into a corresponding mounting cap and are securely held there.

In a further refinement, the second outer contact area is formed by the outer face of the housing.

It is advantageous here for the bottom part to be manufactured from metal, this allowing good electrical and thermal contact with the mounting cap which is likewise manufactured from metal, the rim of which mounting cap is then used both for mechanically holding and also for electrically connecting the switch.

In a further refinement, the second outer contact area is arranged on the top face of the housing.

It is advantageous here for the two outer connections to be located on the cover, so that standard switches for high currents can also be used with the new mounting cap. Here, the rim of the mounting cap serves only for mechanical holding; the bottom part does not necessarily have to be composed of metal, and the cover can also consist of PCT material.

In a further refinement, at least one connection contact which is electrically conductively connected to the first outer contact area projects laterally out of the housing, wherein two connection contacts which are electrically conductively connected to the first and the second outer contact area, respectively, preferably project laterally out of the housing, wherein the first and the second outer contact area are arranged on the top face of the housing.

It is advantageous here for standard switches with an insert housing, as are known from DE 198 16 807 A1 for example, to be able to be inserted into the mounting cap. The lateral connection contacts may have to be provided with stranded wires for this purpose, which stranded wires are then guided to contact areas on the top face.

In a further refinement, the housing is held in the mounting cap in a clamping manner.

It is advantageous here for the mounting cap to be able to be in the form of a ring without a base. The switch is then round and is pushed into the possibly previously slightly heated ring, this rendering rapid assembly possible.

In a further refinement, the mounting cap has a base on which the housing rests by way of its bottom side, wherein the base preferably has a central opening which preferably exposes at least 50% of the bottom side.

It is firstly advantageous here for the switch to be easily positioned in relation to the rim of the mounting cap; it merely has to be pushed into said mounting cap as far as the base. Secondly, the opening in the base of the mounting cap allows good thermal coupling to the device to be protected.

In a further refinement, the space which forms on the top face of the housing between the wall of the mounting cap and the top face of the switch is filled with a sealing means, such as a lacquer or resin for example.

It is advantageous here for the switch to be able to be hermetically sealed and therefore used in applications up to very high safety classes. A further advantage is that a fixed connection between the switch and the mounting cap is established by the sealing means, so that the switch which is provided with the mounting cap can be stored as a semi-finished product, wherein the switch is already hermetically sealed.

One or two contact areas for the outer connection, which contact areas are left free of the sealing means in one refinement, are located on the top face of the switch, so that the spacers can be mounted, in particular can be soldered or welded, only in the case of subsequent use. In another refinement, the spacers are mounted on the connection area or the connection areas, before the space between the wall of the mounting cap and the top face of the switch is filled with the sealing means.

In a further refinement, at least one first connection area is formed on the top face of the housing, a first spacer on which the first outer contact area is formed being connected to said first connection area, wherein a second connection area is preferably formed on the top face of the housing, a second spacer on which the second outer contact area is formed being connected to said second connection area, and further preferably the first and/or second spacer is in the form of a welding elbow.

It is advantageous here for the height difference between the rim of the mounting cap and each of the contact areas to be able to be easily equalized, wherein the welding elbows provide flexible equalization of the height difference and a simple way of freely selecting the position of the contact areas on the top face.

In a further refinement, provision is made for the wall of the mounting cap to be interrupted.

This has the advantage that the contact resistance, which is created by the mounting cap, can be reduced in this way. Nevertheless, it is guaranteed that the housing of the switch is held in the mounting cap in a sufficiently stable manner.

By way of example, the wall of the mounting cap can be interrupted by individual clearances or cutouts. Therefore, in this refinement, the mounting cap does not have a complete wall which extends over the entire periphery of the mounting cap. Individual peripheral parts of the wall of the mounting cap can be left free.

In a refinement, the mounting cap comprises a plurality of webs which are spaced apart from one another in the peripheral direction, wherein an inner side of the webs, which inner side faces the housing, forms the inner side of the interrupted wall of the mounting cap.

Webs of this kind have the advantage that, in spite of a relatively small size, they can ensure a stable fit of the switch housing within the mounting cap. The respective inner side of the webs preferably bears flush against the outer face of the housing and provides for a clamping action by way of which the switch housing is held in the mounting cap.

By way of example, two, three, four or more than four of said webs can be provided, which are spaced apart from one another in the peripheral direction and form a portion of the mounting cap.

In a further refinement, the webs are each substantially L-shaped in cross section.

This has the advantage that the webs act in the manner of claws which firmly clamp or firmly hold the switch housing. In order to be able to ensure this, the L-shaped webs or claws are preferably designed with a spring. This has the advantage that the webs or claws yield to a certain extent when the switch housing is pushed into the mounting cap and, in the process, can perform a deflection movement in the radial direction for example.

In a further refinement, the webs each have a first web section, which bears against the outer face of the housing, and a second web section, which is angled in relation to the first web section and on which the housing rests by way of its bottom side.

The first web sections therefore bear peripherally against the outer face of the switch housing and the second web sections support the switch housing from its bottom side. The webs therefore serve not only as individual claws, but rather jointly form a kind of basket in which the switch or the switch housing is securely held. Since this basket does not completely surround the switch housing, but rather contact is made with the switch housing only along the individual webs, the contact resistance, as already mentioned above, can be considerably reduced.

Furthermore, it is preferred in this refinement for the first web sections of the webs to extend along axes which are parallel to one another, and for the second web sections to lie in a common plane which is oriented transversely to the axes of the first web sections.

Herein, "transversely" is understood to mean any non-parallel orientation. That is to say, "transversely" means non-parallel, and accordingly any angle other than 0°. The plane in which the second web sections lie is preferably oriented orthogonally to the axes of the first web sections. The second web sections therefore form a kind of base on which the switch housing can rest in a stable manner by way of its bottom side. The first web sections which run orthogonally to said second web sections clamp the switch housing from its outer face and preferably each exert a pressure radially inward onto the switch housing.

Furthermore, it is preferred in this refinement for at least one of the webs to be cohesively connected to the housing.

This has the advantage that the connection between the mounting cap and the switch housing is even more stable. Slipping of the switch housing within the mounting cap is virtually ruled out as a result.

Not only one of the webs, but rather each of the webs, is preferably cohesively connected to the housing. By way of example, the webs can be welded, soldered or adhesively bonded to the housing. The webs are each particularly preferably welded, soldered or adhesively bonded to the switch housing by way of their second web section.

In the refinement of the mounting cap with an interrupted wall and individual webs, it is further preferred for the webs to be connected to one another by means of a substantially annular collar which, on a top face which is averted from the webs, has a substantially circular support area which forms the upper rim of the mounting cap.

The circular support area, which forms the upper rim of the mounting cap, preferably lies in a plane with the first outer contact area in the mounted state of the switch. This ensures the orientation of the rim of the mounting cap and the first outer contact area in relation to one another, this being very important for SMD mounting. Since the upper rim of the mounting cap and the circular support area lie in a plane with the first outer contact area of the switch, the switch, together with the mounting cap upside-down, can be arranged on a printed circuit board and the rim and also the first outer contact area can be connected (e.g. soldered) to corresponding conductor tracks, without height equalization between the rim of the mounting cap and the first outer contact area being absolutely necessary for this purpose.

Said orientation of the rim of the mounting cap with the first contact area of the switch is performed during production, preferably in a tool which carries out mounting of the switch within the mounting cap. In this case, the mounting cap is placed onto a planar surface of the tool by way of the circular support area, and the switch is first inserted into the mounting cap by way of the cover part in such a way that the first outer contact area, which is arranged on the cover part, likewise rests on the planar surface of the tool. The first outer contact area and the upper rim of the mounting cap are therefore necessarily level. Said second web sections are then angled in relation to the first web sections, this occurring, for example, owing to said second web sections being bent over or beaded. The second web sections are bent over or beaded in such a way that they bear against the bottom side of the bottom part of the switch housing. Afterward, said second web sections can additionally also be further cohesively connected to the switch housing, as already mentioned.

Finally, a stable connection between the mounting cap and the switch housing is produced, this simultaneously ensuring that the first outer contact area of the switch, which first outer contact area is arranged on the cover part, lies in a common plane with the upper rim of the mounting cap.

The main advantage of mounting of this kind is that it can be realized in a very simple and therefore economical manner. Since, in addition, no further height adjustment is required, the switch, together with the mounting cap, can be fitted on a printed circuit board by SMD mounting in a very simple and therefore likewise cost-effective manner.

In a further refinement, the switching mechanism supports a moving contact part which interacts with a stationary mating contact which is arranged on an inner side of the cover part and interacts with the first outer contact area which is arranged on the top face, or the switching mechanism supports a current transfer element which interacts with two stationary mating contacts which are arranged on an inner side of the cover part and in each case one of which interacts with one of two outer contact areas which are arranged on the top face, wherein the switching mechanism preferably has a bimetallic part and a spring-mounted snap-action disk.

In a further refinement, the first outer contact area faces a first soldering area, which is provided on the printed circuit board, and is soldered to said first soldering area, and the rim of the mounting cap faces a second soldering area, which is provided on the printed circuit board, and is soldered to said second soldering area, wherein the second soldering area is preferably an annular soldering area, and the rim, along its entire periphery, is continuously soldered to the second soldering area.

It is advantageous here for the rim of the mounting cap to serve not only for making electrical contact, but rather simultaneously to also serve as a barrier against the ingress of impurities because, specifically, the top face of the switch is effectively protected against the ingress of particulate or liquid impurities by the soldering of the rim, which soldering acts as a barrier.

In a further refinement, the second outer contact area is arranged on the rim, where, as an alternative, the second outer contact area can also be arranged on the top face of the cover part and is soldered to a third soldering area which is provided on the printed circuit board.

It is advantageous here for the rim to be able to serve both for mechanical fixing and also for forming a barrier against soiling, wherein said rim can also simultaneously serve as a second contact area.

In a further refinement, a ventilation bore is provided in the printed circuit board, said ventilation bore leading into a space which is formed between the printed circuit board and the rim of the mounting cap.

It is advantageous here for no excess pressure, which would counteract reliable mechanical and electrical connection of the contact areas to the soldering areas on the printed circuit board, to build up in this space, which is completely closed off to the environment after soldering of the rim.

According to a further aspect, a temperature-dependent switch is presented, having a housing which comprises a cover part with a top face and a bottom part with an encircling outer face, having at least one first outer contact area which is arranged on the top face of the cover part, at least one second outer contact area which is arranged on the outside of the housing, with the cover part being held on the bottom part, and having a temperature-dependent switching mechanism which is arranged in the housing and, depending on its temperature, establishes or opens an electrically conductive connection between the first and the second outer contact area, wherein the housing is received in a metal mounting cap with an encircling wall, the upper rim of which wall protrudes beyond the top side of the cover part, and the inner side of which wall bears against the outer face of the bottom, wherein the upper rim lies in a plane with the first outer contact area.

It goes without saying that the features mentioned above and those still to be explained below can be used not only in the respectively indicated combinations but also in other combinations or on their own, without departing from the spirit and scope of the present disclosure.

DETAILED DESCRIPTION OF THE PREFERRED EMBODIMENTS

Figure 1:
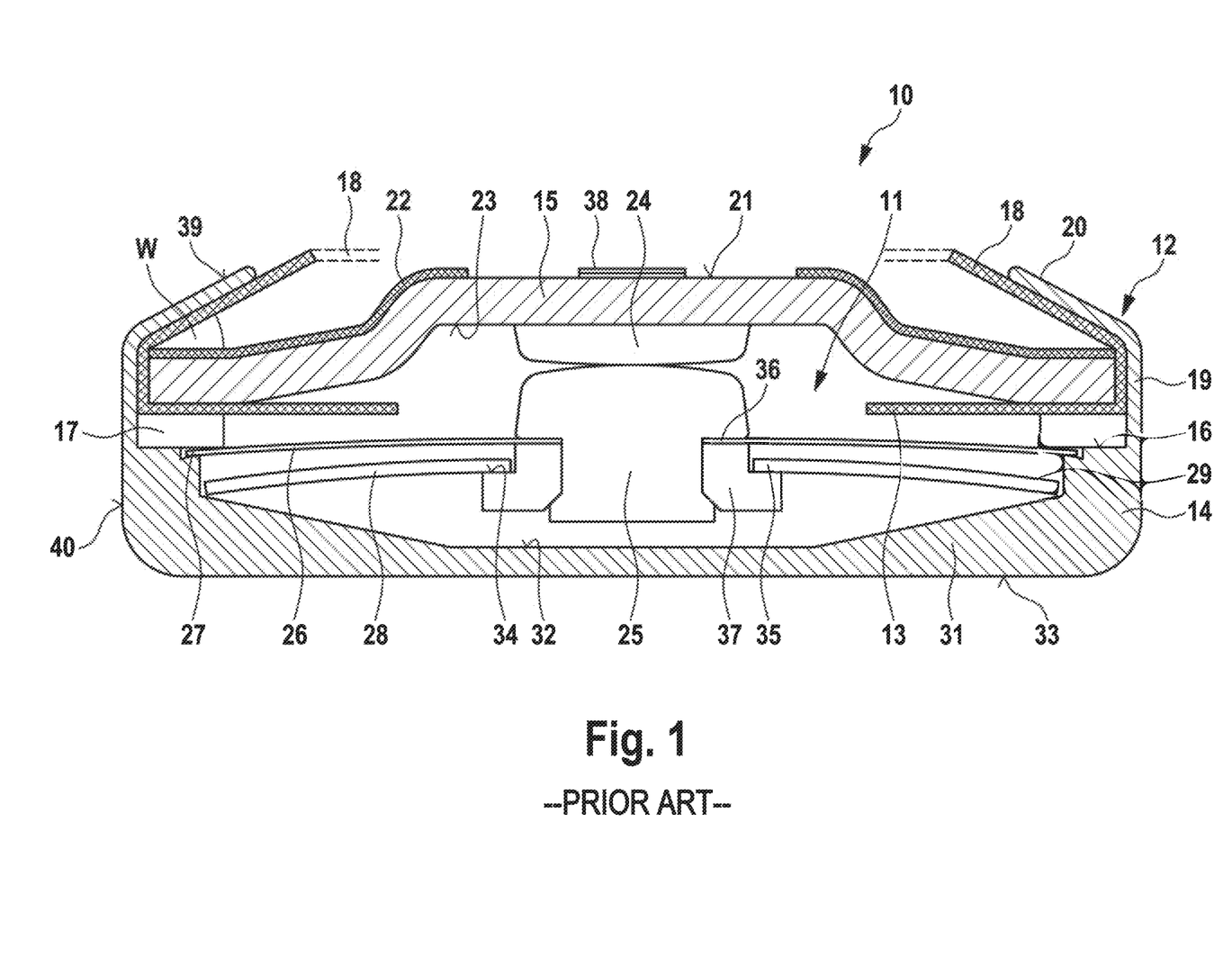
FIG. 1 shows a schematic sectional illustration of a side view of a temperature-dependent switch from the prior art.

FIG. 1 schematically shows a lateral section through a temperature-dependent switch 10 which is circular in plan view.

The switch 10 has a temperature-dependent switching mechanism 11 which is arranged in a housing 12 in which an insulating film 13 is arranged, which insulating film runs between a pot-like bottom part 14 and a cover part 15 which closes the bottom part 14.

An encircling, stepped shoulder 16 is provided in the bottom part 14, a spacer ring 17 being arranged on said shoulder, the cover part 15 resting on said spacer ring with the interposition of the insulating film 13, the edge region 18 of said insulating film 13 extending as far as the top face of the cover part 15.

The bottom part 14 has an encircling wall 19, the upper section 20 of which engages over the cover part 15. The upper section 20 is bent radially inward such that it pushes the cover part 15 onto the spacer ring 17 and said spacer ring onto the encircling shoulder 16.

In the exemplary embodiment shown, the bottom part 14 and the cover part 15 are manufactured from electrically conductive material, for which reason the insulating film 13 which runs around the cover part 15 is provided, which insulating film runs parallel to the cover part 15 on the inside of the housing 12, is routed upward laterally between the wall 19 and the cover part 15 and faces upward by way of its edge region 18.

In this case, the upper section 20 of the wall 19 rests flat on the edge region 18 of the insulating film 13 and pushes said edge region in the direction of the top face 21 of the cover part 15. In this case, the stiff insulating film 13, which is folded radially inward at its edge region 18 in this way, is corrugated in its edge region 18 and forms folds, as a result of which it exerts a counterpressure onto the upper section 20, so that the edge region 18 and the upper section 20 run toward the top face 21 at an angle W of approximately 30°.

Owing to this structure, the edge region 18 protrudes upward beyond the upper section 20.

A further insulating covering 22, which extends radially outward as far as the edge region 18 of the insulating film 13, is provided on the top face 21 of the cover part 15 which is simultaneously the top face of the housing 12.

A stationary mating contact 24 is arranged on an inner side 23 of the cover part 15, a moving contact part 25 which is supported by the switching mechanism 11 interacting with said mating contact.

The switching mechanism 11 comprises a spring-mounted snap-action disk 26 which, by way of its rim 27, is permanently clamped between the spacer ring 17 and the shoulder 16, so that it establishes a permanent electrically conductive connection there.

A bimetallic snap-action disk 28 which has two geometric temperature settings, the low temperature setting shown in FIG. 1 and a high temperature setting which is not shown, is provided below the spring-mounted snap-action disk 26, that is to say on its side which faces away from the stationary mating contact 24.

The bimetallic snap-action disk 28, by way of its rim 29, is situated freely above a wedge-shaped, encircling shoulder 31 which is formed on an inner base 32 of the bottom part 14.

The bottom part 14 has a bottom side 33 by way of which thermal contact with a device to be protected is established.

The bimetallic snap-action disk 28 is supported on an encircling shoulder 34 of the contact part 25 by way of its center 35.

The spring-mounted snap-action disk 26, by way of an inner region 36 in its center, is permanently connected to the moving contact part 25, to which end a ring 37, on which the shoulder 34 is also formed, is pressed onto the pin 30 of said moving contact part, which pin protrudes through the two snap-action disks 26 and 28.

The stationary mating contact 24, which is electrically conductively connected to the top face 21, interacts with the moving contact part 25 and, by means of said moving contact part, with the inner region 36 of the spring-mounted snap-action disk 26 which is mechanically and electrically permanently connected to the shoulder 16 and, by means of said shoulder, to the bottom part 14.

The top face 21 serves as a first outer contact area 38 which is indicated by a black area. In the case of the known switch, the bottom side 33 of the bottom part 14 serves as a further contact area, wherein it is also known to use the upper section 20 of the wall 19 or the outer face 40 of the bottom part 14, which is simultaneously the outer face of the housing 12, as the second outer contact area 39.

In the closed switching position, shown in FIG. 1, of the switch 10, the moving contact part 25 is pushed against the stationary mating contact 24 by the spring-mounted snap-action disk 26. Since the electrically conductive spring-mounted snap-action disk 26, by way of its rim 27, is connected to the bottom part 14, an electrically conductive connection is established between the two outer contact areas 38, 39.

When the temperature in the interior of the switch 10 is now increased beyond the response temperature of the bimetallic snap-action disk 28, said bimetallic snap-action disk folds over from the convex configuration, shown in FIG. 1, to a concave configuration in which its rim 29 moves upward in FIG. 1, so that it comes into contact with the rim 27 of the spring-mounted snap-action disk 26 from below.

In this case, the bimetallic snap-action disk 28, by way of its center 35, pushes onto the shoulder 34 and therefore lifts the moving contact part 25 away from the stationary mating contact 24.

The spring-mounted snap-action disk 26 can be a bistable spring-mounted disk which is also geometrically stable in the open position of the switch, so that the moving contact part 25 also does not come into contact with the stationary mating contact 24 again when the rim 29 of the bimetallic snap-action disk 28 no longer pushes against the rim 27 of the spring-mounted snap-action disk 26.

If the temperature in the interior of the switch 10 now decreases again, the rim 29 of the bimetallic snap-action disk 26 moves downward and comes into contact with the wedge-shaped shoulder 31. By way of its center 35, the bimetallic snap-action disk 26 then pushes against the spring-mounted snap-action disk 26 from below and pushes said spring-mounted snap-action disk 26 into its other geometrically stable position again, in which it pushes the moving contact part 25 against the stationary mating contact 24 according to FIG. 1.

In the present exemplary embodiment, the switching mechanism 11 has, in addition to the bimetallic snap-action disk 28, the current-carrying spring-mounted snap-action disk 26, wherein only the bimetallic snap-action disk 28 which would then be clamped, by way of its rim 29, under the encircling ring 17 and carry the current can also be provided in the switching mechanism 11.

It is also possible to arrange the bimetallic snap-action disk 28 above the spring-mounted snap-action disk 26.

Figure 2:
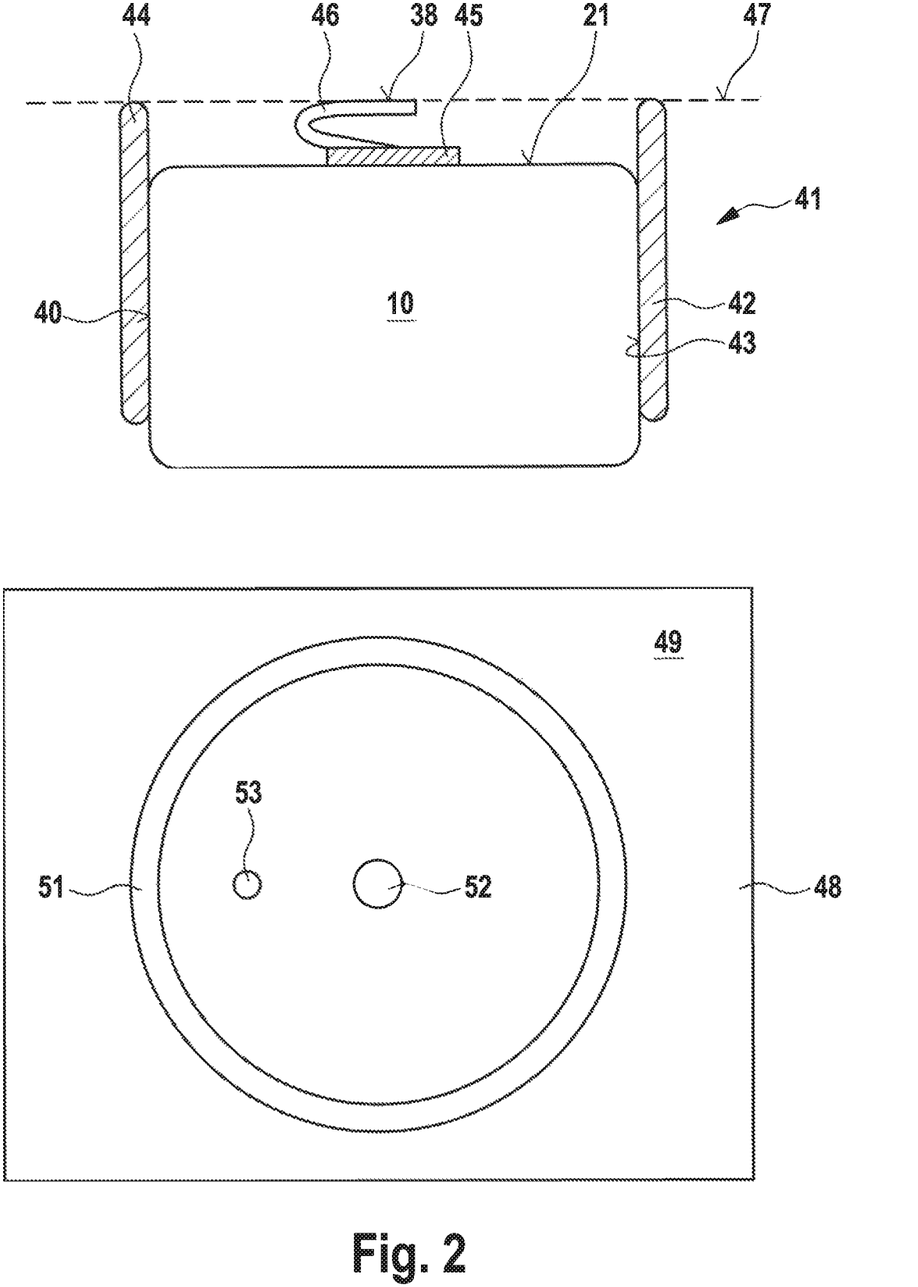
FIG. 2 shows a schematic, partially sectioned illustration of a side view of a modified embodiment of the switch from FIG. 1 which is arranged in a mounting cap and is provided with a welding elbow, and at the bottom a plan view of a printed circuit board onto which the switch is soldered.

FIG. 2 shows the use of the switch 10 from FIG. 1, wherein the switch 10 itself is only schematically illustrated. The switch 10 is arranged in a metal mounting cap 41, illustrated in section, the annular wall 42 of said mounting cap, by way of its inner side 43, bearing against the outer face 40 of the switch 50 over its entire surface area and, by way of its upper rim 44, protruding beyond the top face 21 of the switch 10.

The close mechanical contact between the annular mounting cap 41 and the outer face 40 is achieved by way of the mounting cap 41 being heated before the switch 10 is inserted. After cooling, the switch 10 is then fixedly held in the mounting cap 41.

Here, the top face 21 of the cover part 15 serves as the first outer connection of the switch 10, a connection area 45 to which a welding elbow 46 which, at its outer end, supports the first outer contact area 38 is welded being located on said top face, wherein the end is bent over such that it lies in a plane, indicated by 47, with the rim 44 by way of the contact area 38. In this case, the end of the welding elbow 46 can also be further bent subsequently, until the contact area 38 lies in the plane 47.

The second outer contact area 39 is formed by the outer face 40 which is electrically conductively connected to the rim 44 by the close mechanical contact to the inner side 43 of the wall 42 and also electrically by means of said inner side.

The switch 10 which is held in the annular mounting cap 41 is soldered upside-down onto a printed circuit board 48, wherein the rim 44 and the contact area 38 are soldered to corresponding soldering areas on the printed circuit board 48, shown at the bottom in FIG. 2, the top face 49 of which printed circuit board lies in the plane 47.

An annular soldering area 51, which corresponds to the rim 44 in respect of diameter, is provided on the top face 49 of the printed circuit board 48. A soldering area 52, which serves to make contact with the contact area 38, is provided centrally within the annular soldering area 51.

Since the welding elbow 46 flexes easily, a low projection of the contact area 38 beyond the plane 47 can be equalized by light pressure. In this way, a position of the switch 10 in the mounting cap 41, which position differs from the ideal situation, can be compensated for by the welding elbow 46.

A ventilation bore 53 is further provided between the annular soldering area 51 and the central soldering area 52 in the printed circuit board 48.

As is customary in the case of SMD mounting, solder pastes are applied to the annular soldering area 51 and also to the central soldering area 52, after which the switch 10 is then placed, as it were, upside-down onto the printed circuit board 48 such that the solder pastes are located between the annular soldering area 51 and the rim 44 and also between the central soldering area 52 and the contact area 38.

In accordance with the customary reflow technique, the soldering areas 51, 52 and the rim 44 and also the contact area 38 are now soldered to one another. In the process, a space forms between the printed circuit board 48 and the rim 44, which space is ventilated by the ventilation bore 53, so that no interfering mechanical forces occur during soldering.

Figure 3:
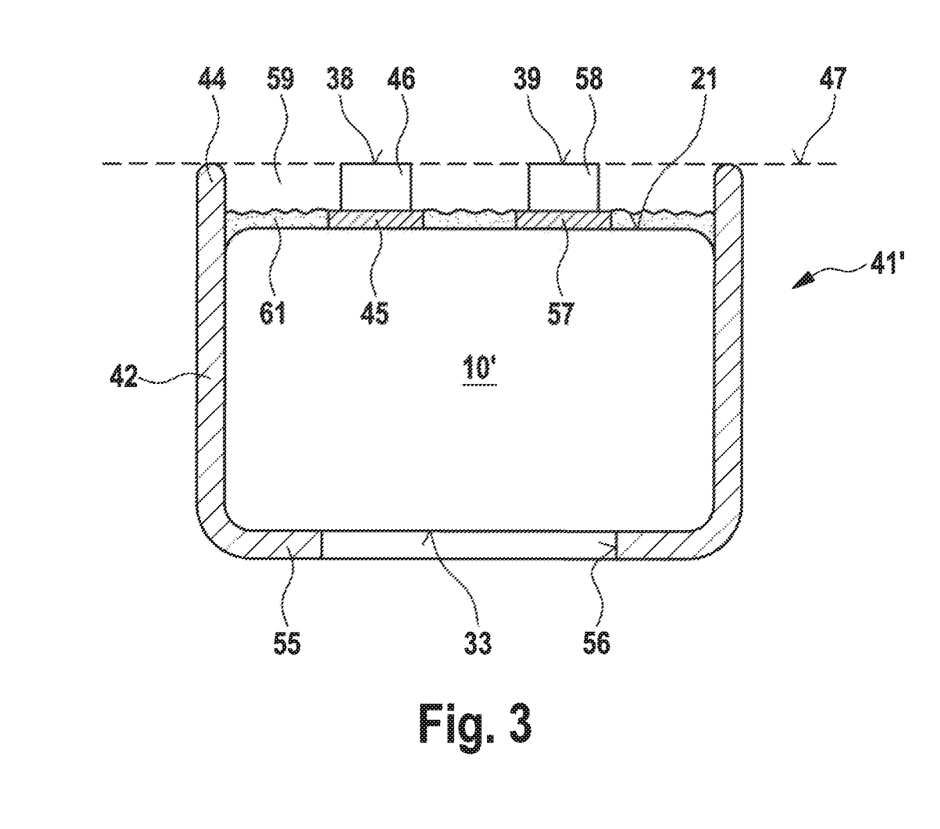
FIG. 3 shows an illustration, like FIG. 2, of a mounting cap with a temperature-dependent switch received therein, in which the two outer connections are arranged on the top face of the switch.

Whereas the mounting cap 41 is of annular design in FIG. 2, the mounting cap 41' shown in FIG. 3 has a base 55 with a central opening 56 which exposes at least 50% of the bottom side 33 of the switch 10', so that a good thermal connection to the device to be protected is ensured.

In the outer edge region, the bottom side 33 rests on the inside of the base 55 when the switch 10', shown here, has been pushed into the mounting cap 41' as far as said stop. This results in simple and reliable positioning of the rim 44 of the mounting cap 41' in relation to the top face 21 of the switch 10 or to the first outer contact area 38 provided there.

The switch 10' has, on the top face 21, the first connection area 45 already known from FIG. 2 and also a second connection area 57. Spacers 46 and, respectively, 58, which can be designed as welding elbows or blocks, are positioned on the two connection areas 45, 57. The second outer contact area 39 is located on the second spacer 58.

The space 59 which is formed between the wall 42 of the mounting cap 41 and the top face 21 is filled with a sealing means 61 in order to prevent the ingress of dirt and moisture into the switch 10'.

Figure 4:
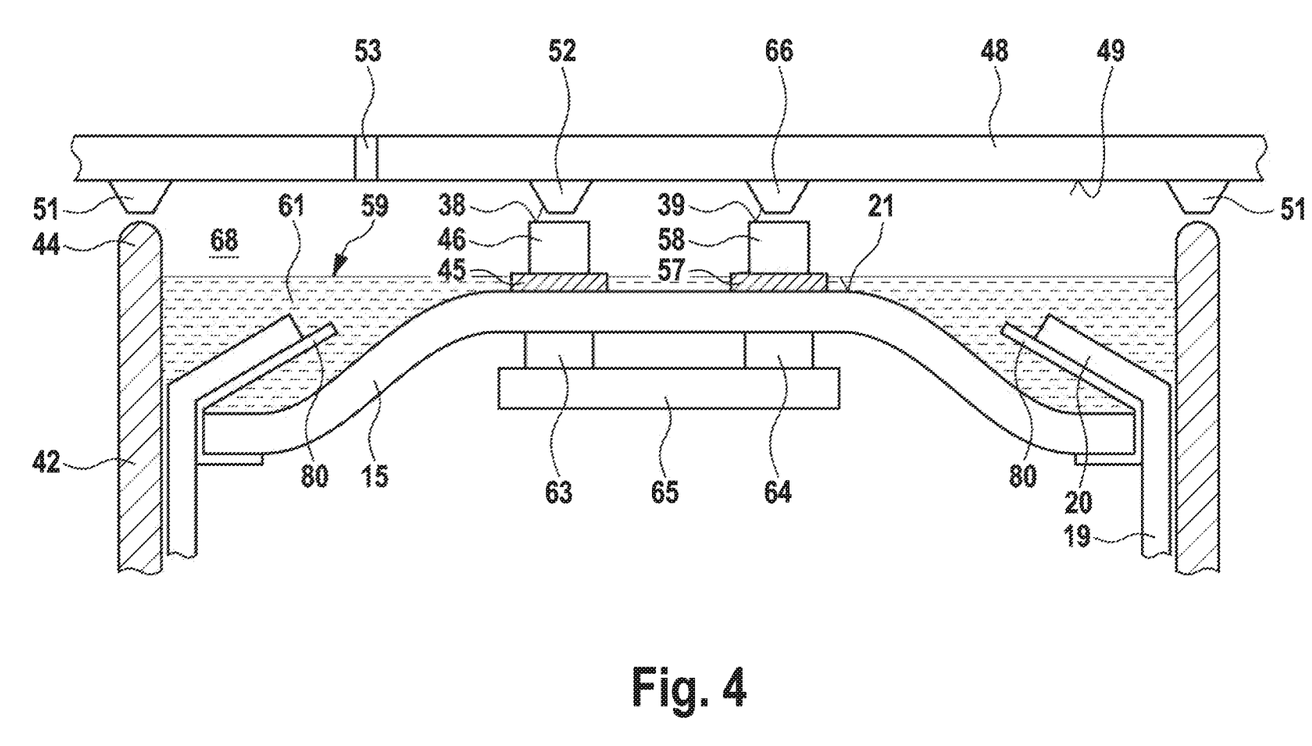
FIG. 4 shows a schematic, partially sectioned partial illustration of a side view of the switch from FIG. 3 mounted on a printed circuit board.

Whereas FIGS. 1 and 2 show a switch 10 in which the temperature-dependent switching mechanism 11 supports a moving contact part 25 which is in contact with a stationary mating contact 24 with which contact is made through the cover part 15 outward to the first outer contact area 38, FIGS. 3 and 4 show an alternative refinement of a switch 10' in which two stationary mating contacts 63, 64 are arranged on the inside of the cover part 15.

The two stationary mating contacts 63, 64 interact with a current transfer element 65 which is moved by the temperature-dependent switching mechanism, not shown in FIGS. 3 and 4.

A sealing film 80, which provides for sealing of the interior of the switch 10', is arranged between the cover part 15 and the upper section 20 of the wall 19. This sealing is further assisted by the sealing means 61 in the space 59, which sealing means also passes between the section 20, the sealing film 80 and the top face 21, so that a hermetically sealed switch 10' is produced.

It goes without saying that, in the case of the switch 10 from FIGS. 1 and 2, the sealing means 61 can also be provided in the space 59 between the wall 42 of the mounting cap 41 and the top face 21 in order to prevent the ingress of dirt and moisture into the switch 10'. In this case, the sealing means also reaches the insulating films 13 and 22, so that the switch 10 is also hermetically sealed.

The two stationary mating contacts 63, 64 interact with the two outer connection areas 45 and 57 to which they are electrically connected. The spacers 46, 58 on which the contact areas 38, 39 are located are again mounted on the connection areas 45 and 57.

The switch 10' is also mounted on a printed circuit board 48 in SMD fashion, as can be seen in the schematic side view of a detail in FIG. 4.

In addition to the two soldering areas 51 and 52 for the rim 44 and, respectively, the first contact area 38, a third soldering area 66 for the contact area 39 is provided on the top face 49 of the printed circuit board 48 in order to electrically connect the switch 10'.

The annular soldering area 51 is again provided for the rim 44 in order to mechanically fix the switch 10'. When the rim 44 is connected to the annular soldering area 51 along its entire periphery, the rim 44 serves as a barrier against the ingress of impurities.

In this case too, a space 68, which is ventilated by the ventilation bore 53, forms between the printed circuit board 48 and the rim 44, so that no interfering mechanical forces occur during soldering.

Figure 5:
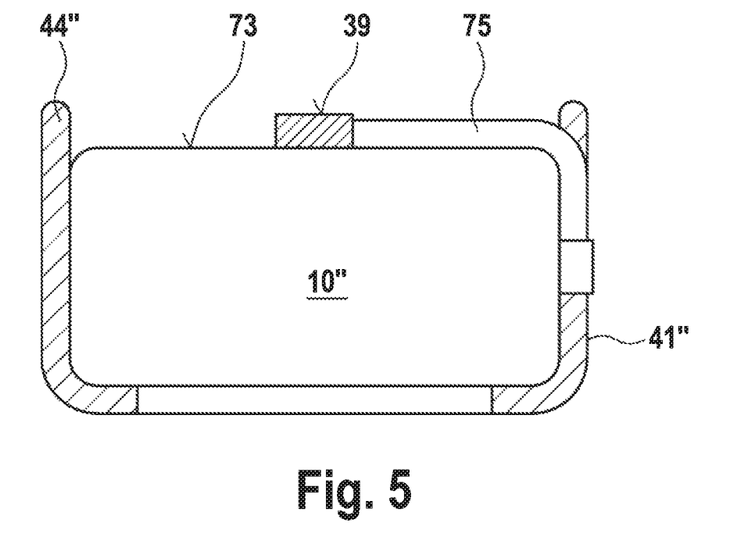
FIG. 5 shows an illustration, like FIG. 2, of a mounting cap with a temperature-dependent switch received therein, in which the two outer connections are routed laterally out of the housing.
Figure 6:
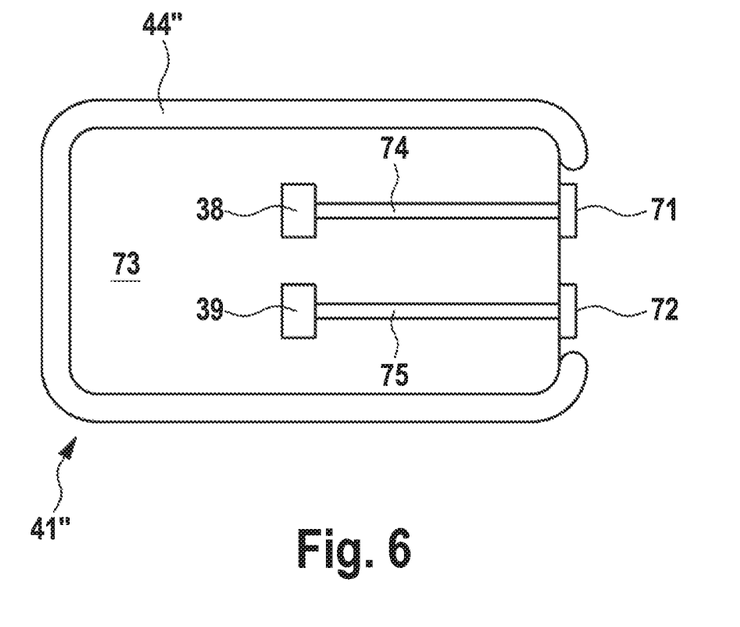
FIG. 6 shows a schematic illustration of a plan view of the switch from FIG. 5.

FIG. 5 shows an illustration like FIG. 2 and FIG. 6 shows a plan view of a mounting cap 41" with a temperature-dependent switch 10" received therein, in the case of which switch two connection contacts 71, 72 are routed laterally out of the housing 73. Switches of this kind are usually flat and rectangular, as is known from document DE 198 16 807 A1 mentioned at the outset.

The two connection contacts 71, 72 are routed via connections 74, 75 onto the top face 76 of the housing 73, where they are connected to the contact areas 38, 39.

Like the switch 10", the mounting cap 41" has a rectangular shape with side walls 42" which have an upper rim 44" which serves merely for mechanical holding like the rim 44 in FIG. 4 in the case of SMT mounting. The contact areas 38, 39 are connected to corresponding soldering areas on a printed circuit board.

Figure 7:
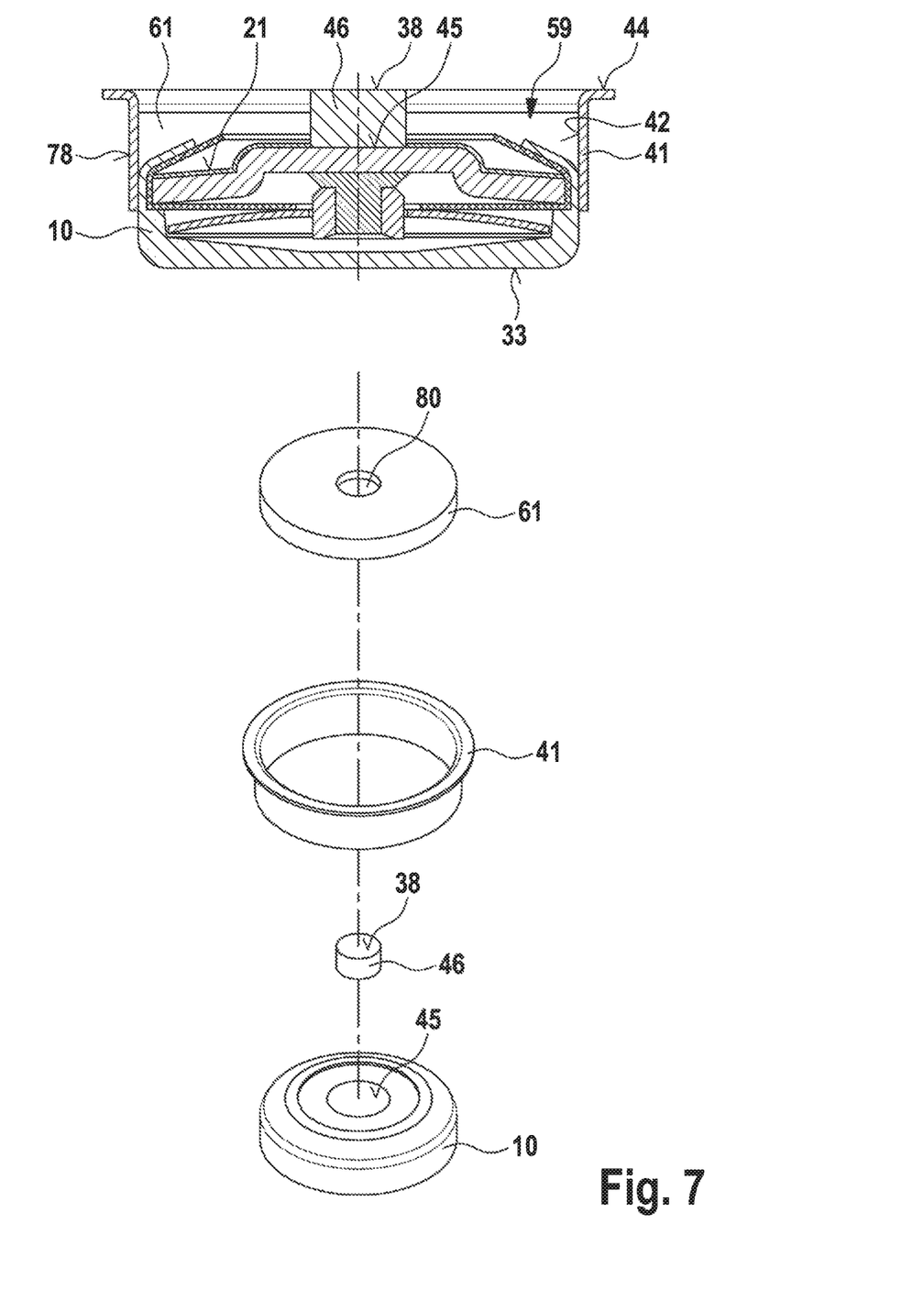
FIG. 7 shows a further embodiment of a modified switch 10, as in FIG. 1, arranged in a mounting cap, in a sectioned side view at the top and in an exploded illustration at the bottom.

FIG. 7 shows a comparable switch 10 to that in FIG. 1, only arranged in a mounting cap 41, specifically in a sectioned side view at the top in FIG. 7 and in an exploded illustration at the bottom in FIG. 7.

The rim 44 of the mounting cap 41 is bent outward and lies in a plane with the contact area 38 at the top on the spacer 46 which is fixed on the first connection area 45. As in the case of the switch 10 from FIG. 1, the bottom side 33 of the switch 10 serves as the second connection area.

When the mounting cap 41 is manufactured from conductive material, the outer surface 78 of the mounting cap 41 can also serve as the second connection area.

As in the case of the switch from FIG. 4, a sealing means 61 is inserted into the space 59 between the wall 42 of the mounting cap 41 and the top face 21 in order to prevent the ingress of dirt and moisture into the switch 10' in the case of the switch 10 from FIG. 7 too. The spacer 46 protrudes through the sealing means 61 which hermetically seals the entire space 59.

The cured sealing means 61 is illustrated as a disk at the bottom in FIG. 7, a central hole 80 through which the spacer 46 protrudes being identifiable in said disk. It goes without saying that the sealing means 61 is not provided as a disk, but rather is inserted into the space 59 in liquid form and solidifies to form a disk. The disk is shown at the bottom in FIG. 7 for illustrative purposes only.

Figure 8:
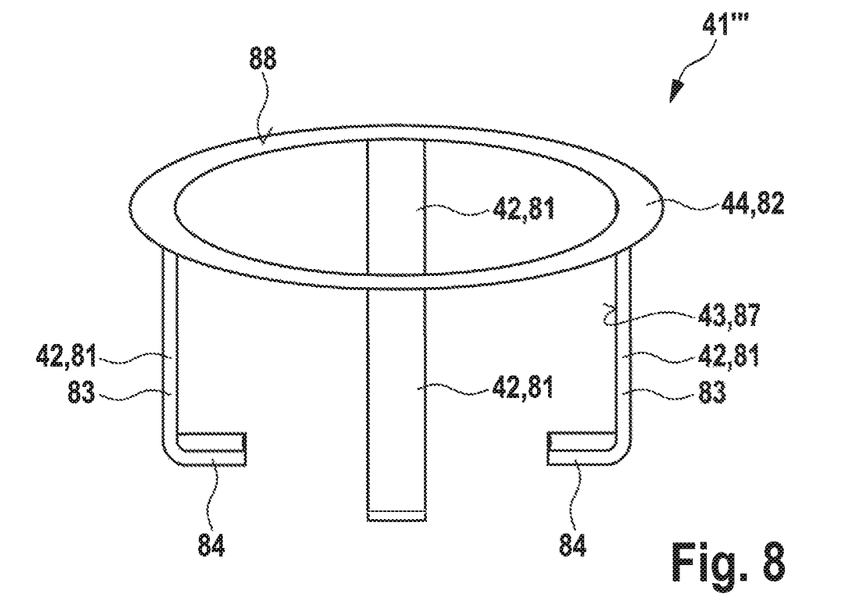
FIG. 8 shows a schematic illustration of a perspective view of a further exemplary embodiment of the mounting cap.
Figure 9:
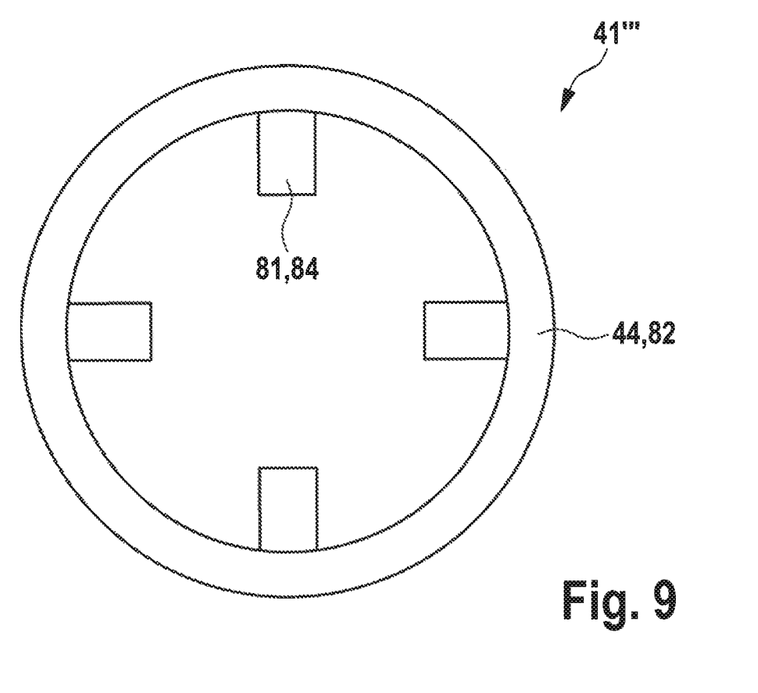
FIG. 9 shows a schematic illustration of a plan view of the mounting cap shown in FIG. 9.
Figure 10:
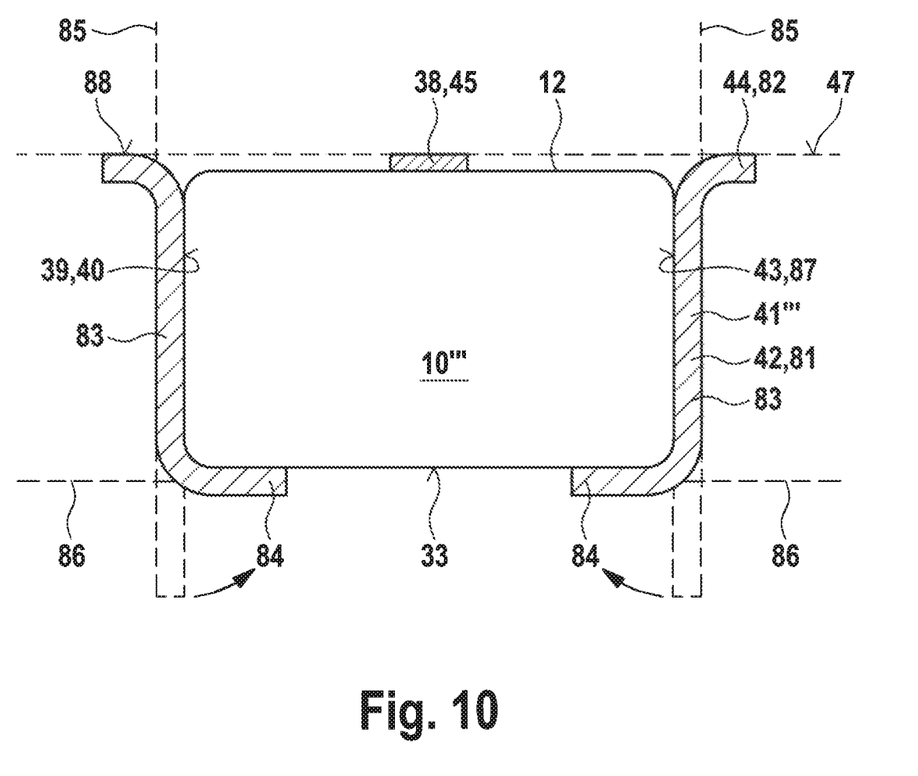
FIG. 10 shows a schematic illustration of a sectional view through the mounting cap shown in FIGS. 8 and 9 with the switch mounted therein.

FIGS. 8-10 show a further exemplary embodiment of the mounting cap 41'''. FIGS. 8 and 9 show a perspective view and also a plan view, from above, of the mounting cap 41''' without the switch installed therein. FIG. 10 shows a schematic sectional view through the mounting cap 41''' with the switch 10''' installed therein.

In contrast to the mounting caps 41, 41', 41" according to the above-described exemplary embodiments, the mounting cap 41''' does not have a continuously closed wall 42. Instead, the wall 42 of the mounting cap 41''' is of interrupted design. Instead of being closed at the periphery, said wall 42 has a plurality of clearances or intermediate spaces.

Here, the wall 42 is formed by a plurality of webs 81. In the exemplary embodiment shown in FIGS. 8-10, the mounting cap 41''' has four webs 81 which are spaced apart from one another in the peripheral direction. Each of these webs 81 is substantially L-shaped in cross section. The webs 81 act in the manner of claws which hold the switch 10''' or the housing 12 of the switch 10''', as shown in FIG. 10, from the outside. The webs 81 together form a kind of basket-like holder for the switch 10'''.

The webs 81, in the region of their upper end, are connected to one another by means of a collar 82. This collar 82 serves not only to connect the webs 81 to one another, it forms the upper rim 44" of the mounting cap 41'''. The collar 82 is of substantially annular design. At its top face, said collar has an annular support area 88 with the aid of which the mounting cap 41''' can be fastened to a printed circuit board by SMD mounting, similarly to the manner already described above.

The webs 81 each have a first web section 83 and also a second web section 84. The first web sections 83 of the individual webs 81 run along a plurality of axes 85 which are parallel to one another and are oriented orthogonally to the circular support area 88.

The first web sections 83 therefore project downward from the collar 82. The second web sections 84 are angled through approximately 90° in relation to the first web sections 83 in each case. The second web sections 84 project radially inward from the first web sections 83. The second web sections 84 therefore all lie in a common plane 86 which runs orthogonally to the axes 85 of the first web sections 83.

As is clear from FIG. 10 in particular, the switch housing 12 of the switch 10''' is arranged as if it were in a kind of basket in the mounting cap 41'''. The inner side 87 of the first web sections 83 preferably bears flush against the outer face 40 of the switch housing 12 in the mounted state. In other words, the inner sides 87 of the webs 81 together form the inner side 43 of the, here interrupted, wall 42 of the mounting cap 41''' which supports the switch housing 12 at the periphery.

At its bottom side 33, the switch housing 12 is supported by the second web sections 84. The second web sections 84 preferably bear flush against the bottom side 33 of the switch housing 12.

The height of the mounting cap 41''' is selected such that the first outer contact area 38 lies in a common plane 47 with the support area 88 which is provided on the top face of the collar 82. Height equalization with the aid of spacers 46, 58 or by means of a welding elbow as in the abovementioned exemplary embodiments is not necessary here. The switch 10''', together with the mounting cap 41''', can therefore be very easily fitted on a printed circuit board, where, during SMD mounting, firstly the first outer contact area 38, which simultaneously forms the first connection area 45, is soldered to one conductor track and the support area 88 is soldered to another conductor track. The outer face 40 of the switch housing 12 serves as the second outer contact area 39. Said second outer contact area 39 is electrically conductively connected to the support area 88 by means of the metal mounting cap 41'''. Therefore, the switch 10''' also establishes or disconnects an electrically conductive connection between the support area 88 and the first connection area 45 in a temperature-dependent manner here by means of the switching mechanism 11. Since the support area 88 and the first connection area 45 are arranged in the same plane 47, SMD mounting of the switch 10''' together with the mounting cap 41''' can be performed in a very simple manner. Mounting of the switch housing 12 within the mounting cap 41''' preferably takes place as follows: in the unfinished state, that is to say before mounting, the second web sections 84 are not yet angled in relation to the first web sections 83. This is indicated by dashed lines in FIG. 10. The switch housing 12 can therefore be inserted into the mounting cap 41''', that is to say into the intermediate space between the webs 81, both from above and also from below. To this end, the mounting cap 41''' is preferably placed upside-down, that is to say by way of the support area 88, on a planar surface in a tool. The switch 10''' is then inserted into the mounting cap 41''' in such a way that said switch, by way of the first outer contact area 38 which is arranged on the cover part 15, likewise rests on the planar surface in the tool. The support area 88 and the first connection area 45 are therefore automatically oriented relative to one another in one plane 47. The second web sections 84, as indicated by the arrows in FIG. 10, are then bent over or beaded, so that said second web sections come into contact with the bottom side 33 of the switch housing 12. The mounting cap 41''' is finally preferably further cohesively connected to the switch housing 12. This can be performed, for example, by welding, soldering or adhesively bonding the second web sections 84 to the bottom side 33 of the switch housing 12.

The mounting cap 41''' and the switch 10''' or the switch housing 12 are therefore already inseparably connected to one another before being fitted on a printed circuit board and form a common physical unit which can be stored as a bulk product.

In comparison to the exemplary embodiments shown above, the mounting cap 41''' shown in FIGS. 8-10 has, on account of the relatively small contact area of the webs 81 with the outer face 40 of the housing 12 in respect of surface area, the advantage that the contact resistance is considerably reduced as a result. In addition, the mounting cap 41''' can be of comparatively lightweight design. It can nevertheless be very easily mounted on the switch housing 12.

It goes without saying that a switch 10', as was shown in FIGS. 3 and 4, can also be installed in the mounting cap 41'''. Similarly, it is also possible to design the mounting cap 41''' in several parts, that is to say, for example, to realize the collar 82 and the webs 81 as components which are separate from one another and are cohesively connected to one another. However, designing the collar 82 and also the first and second web sections 83, 84 as an integral component has the advantage of greater stability overall.

It likewise goes without saying that the second web sections 84 do not necessarily have to be shorter than the first web sections 83. The second web sections 84 of the individual webs 81 can also protrude radially further inward and meet, for example, in the center of the base area of the mounting cap 41''. This produces a kind of base area of star-shaped or cross-shaped design of the mounting cap 41'''.

What is claimed is:

1. A temperature-dependent switch comprising:
    a housing with a top face and an outer face that runs transversely to the top face,
    a first outer contact area that is arranged on the top face,
    a second outer contact area that is arranged at the housing, and
    a temperature-dependent switching mechanism that is arranged in the housing and configured to establish or open an electrically conductive connection between the first and the second outer contact area depending on a temperature of the switching mechanism, wherein:
    the housing is disposed in a metal mounting cap that comprises a wall,
    an upper rim of the wall protrudes beyond the top face of the housing,
    an inner side of the wall bears at least partially against the outer face of the housing, and
    the upper rim and the first outer contact area are disposed in a common plane that is parallel to the top face.

2. The switch of claim 1, wherein:
    the housing comprises:
        a cover part, on which the top face is formed and
        a bottom part, on which the outer face is formed and
    the cover part is fastened on the bottom part.

3. The switch of claim 2, wherein the inner side of the wall of the metal mounting cap bears over its entire surface area against the outer face of the housing.

4. The switch of claim 1, wherein the second outer contact area is formed by the outer face of the housing or arranged on the top face of the housing.

5. The switch of claim 1, wherein the housing is clamped in the metal mounting cap.

6. The switch of claim 1, wherein:
    the metal mounting cap has a base with a central opening and
    the housing has a bottom face that rests on the base.

7. The switch of claim 1, wherein a space that forms on the top face of the housing and is surrounded by the wall of the metal mounting cap is filled with a sealing means.

8. The switch of claim 1, wherein:
    a first connection area is formed on the top face of the housing and
    a first spacer, on which the first outer contact area is formed, is connected to the first connection area.

9. The switch of claim 1, wherein the wall of the metal mounting cap is interrupted.

10. The switch of claim 9, wherein:
    the metal mounting cap comprises a plurality of webs that are spaced apart from one another in a peripheral direction and
    an inner side of the plurality of webs, which faces the housing, forms the inner side of the wall of the metal mounting cap.

11. The switch of claim 10, wherein each of the plurality of webs has an L-shaped cross section.

12. The switch of claim 11, wherein:
    each of the plurality of webs comprises:
        a first web section that bears against the outer face of the housing and
        a second web section that is angled in relation to the first web section and on which a bottom face of the housing rests,
    the first web sections of the plurality of webs extend along axes that are parallel to one another, and
    the second web sections lie in a common plane that is oriented transversely to the axes of the first web sections.

13. The switch of claim 10, wherein at least one of the plurality of webs is cohesively connected to the housing.

14. The switch of claim 10, wherein:
    the plurality of webs are connected to one another by an annular collar and
    the annular collar, on a top face thereof that faces away from the plurality of webs, has a substantially circular support area that forms the upper rim of the wall of the metal mounting cap.

15. An electronic circuit comprising:
    a printed circuit board; and
    a temperature-dependent switch that is mounted on the printed circuit board, wherein:
    the switch comprises:
        a housing with a top face and an outer face that runs transversely to the top face;
        a first outer contact area that is arranged on the top face;
        a second outer contact area that is arranged at the housing; and
        a temperature-dependent switching mechanism that is arranged in the housing and configured to establish or open an electrically conductive connection between the first and the second outer contact area depending on a temperature of the switching mechanism,
    the housing is disposed in a metal mounting cap that comprises a wall, an upper rim of the wall protrudes beyond the top face of the housing, an inner side of the wall bears at least partially against the outer face of the housing, the upper rim rests on the printed circuit board, the first outer contact area faces a first soldering area that is provided on the printed circuit board, the first outer contact area is soldered to the first soldering area, the upper rim of the metal mounting cap faces a second soldering area that is provided on the printed circuit board, and the upper rim of the metal mounting cap is soldered to the second soldering area.

16. The electronic circuit of claim 15, wherein:

the second soldering area is an annular soldering area and the upper rim is soldered along its entire periphery to the second soldering area.

17. The electronic circuit of claim 15, wherein the second outer contact area is one of:

arranged on the upper rim or arranged on the top face of the housing and soldered to a third soldering area that is provided on the printed circuit board.

18. An electronic circuit comprising:

a printed circuit board;

a temperature-dependent switch that is mounted on the printed circuit board; and a ventilation bore that is provided in the printed circuit board, wherein:

the switch comprises:

a housing with a top face and an outer face that runs transversely to the top face;

a first outer contact area that is arranged on the top face;

a second outer contact area that is arranged at the housing; and a temperature-dependent switching mechanism that is arranged in the housing and configured to establish or open an electrically conductive connection between the first and the second outer contact area depending on a temperature of the switching mechanism, the housing is disposed in a metal mounting cap that comprises a wall, an upper rim of the wall protrudes beyond the top face of the housing, an inner side of the wall bears at least partially against the outer face of the housing, the upper rim rests on the printed circuit board, and the ventilation bore leads into a space that is formed between the printed circuit board and the upper rim.

* * * * *